Jan. 26, 1971 B. BERNSTEIN 3,558,994

ELECTRICAL COMPONENT SUPPORTING STRUCTURE WITH IMPROVED MOUNTING AND ELECTRICAL CONNECTOR MEANS

Filed April 3, 1969

INVENTOR
BERNARD BERNSTEIN
BY James and Franklin
ATTORNEY

United States Patent Office 3,558,994
Patented Jan. 26, 1971

3,558,994

ELECTRICAL COMPONENT SUPPORTING STRUCTURE WITH IMPROVED MOUNTING AND ELECTRICAL CONNECTOR MEANS

Bernard Bernstein, Brooklyn, N.Y., assignor to General Instrument Corporation, Newark, N.J., a corporation of Delaware Filed Apr. 3, 1969, Ser. No. 813,106
Int. Cl. H02b 1/04
U.S. Cl. 317—101 19 Claims

ABSTRACT OF THE DISCLOSURE

A plurality of electrical units are mounted on a conductive surface of an elongated support, another surface of said support being non-conductive. The units are held in position by a plurality of individual resilient conductor members. Each conductor member has one arm engaging and urging a unit against the conductive surface, and another arm extending toward the insulated surface of the support. A lead section extends beyond the support from each conductor member. Electrical connection to the support is made by a similar conductor member which engages the conductive surface of the support at a location where no unit is mounted.

The present invention relates to an assembly for mounting a plurality of electrical units in a manner such as to facilitate the making of electrical connections to the units.

In recent years, largely as a result of advances in semiconductor technology and the reduction in the size of most electrical components, increased emphasis has been placed on the packaging of these components in electrical apparatus in a manner which is compact, economical, and easy to asemble in large-scale production operations.

One result of this search for improved packaging techniques is the development of individual assemblies or modules on which a plurality of electrical components, forming a complete electrical circuit, are packaged. These modules are interconnected in a predetermined manner to form the electrical apparatus. One widely used electrical circuit is one which requires the various electrical components or units in the circuit to be connected in parallel. In a typical assembly of this type the components are diode rectifiers, the overall assembly thus forming a diode matrix which may be used to advantage to supply the B-plus voltage to the various circuits in an electrical apparatus.

Various arrangements have been proposed in the past for packaging a plurality of such electrical components in a unitary assembly. The acceptance of these assemblies by the industry has been somewhat limited, largely because they have been relatively expensive to assemble and generally required the utilization of an excessive amount of space in the apparatus. Moreover, the initial fabrication of these assemblies has generally been a task requiring a relatively high level of skill on the part of the production personnel. In many of these proposed constructions, production techniques such as soldering, brazing and the like had to be employed to secure the components on the assembly in a manner which would ensure reliable physical retention of components as well as accomplish the electrical connection between the components and the connectors associated therewith. The known constructions often required a relatively large number of additional parts which added considerably to cost and complexity.

It is an object of the present invention to provide a mounting assembly for a plurality of electrical components which is economically and readily assembled even by relatively unskilled personnel.

It is a further object of the present invention to provide a mounting assembly for a plurality of electrical components in which the making of electrical connection to the components and their retention on the assembly is effected by the use of a minimum number of relatively inexpensive parts.

It is yet another object of the present invention to provide a mounting assembly for a plurality of electrical components in which the retention of the components on the assembly and the making of electrical connection to these components are both achieved by unitary conductor elements without the need for operations such as soldering, brazing or the like.

Broadly considered, the mounting assembly of the present invention comprises an elongated support having a conductive and a non-conductive surface. A plurality of electrical components or units are mounted on the conductive surface where one of the terminals of each unit makes electrical contact with that surface. A plurality of resilient conductor elements, one of which may be provided for each of the electrical units, each has an arm which engages the other terminal of the electrical unit and urges that unit against the conductive surface in a manner effective to securely retain the unit in position. Each conductor element also comprises another arm which engages the insulated surface of the support. A lead section is electrically connected to the first mentioned arm and extends beyond the support.

In this manner, electrical connection is made between the conductive surface of the support and one terminal of each of the electrical units, and between the other unit terminal and each of the lead sections of the conductor elements. An electrical circuit is completed by electrically connecting an external circuit to the conductive surface of the suport. The part which provides for that external electrical connection preferably comprises a resilient conductor element similar to the other conductor elements contacting and engaging the electrical units, but which has an arm electrically contacting the conductive surface of the support at a location at which no unit is mounted. The completed circuit defined by this assembly comprises the plurality of electrical units connected in parallel, with one terminal of each unit, the terminal in electrical contact with the conductive surface of the support, being connected to a common point. The other terminals of the units are adapted to be respectively connected to external circuitry through the lead sections extending from their associated conductor elements.

To the accomplishment of the above, and to such other objects as may hereinafter appear, the present invention relates to an assembly for mounting and making electrical connection to a plurality of individual electrical units, as defined in the appended claims and as described in the specification, taken together with the accompanying drawing, in which:

Figures 1, 2:
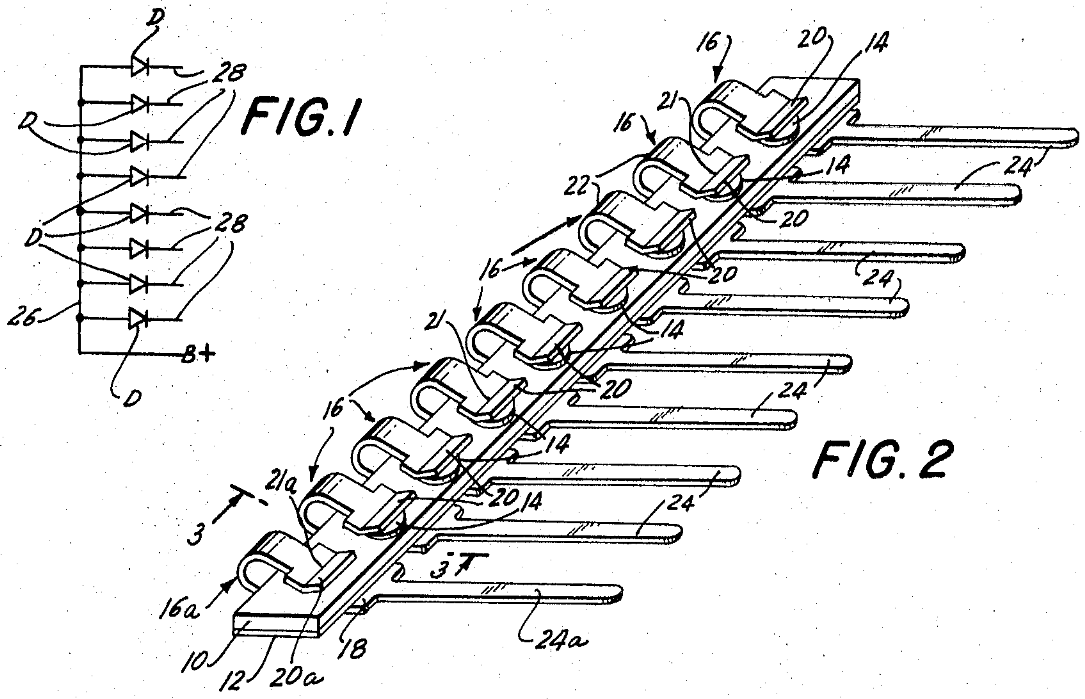
FIG. 1 is an equivalent circuit diagram of the component mounting assembly of the present invention.
FIG. 2 is a perspective view of one embodiment of the mounting assembly of the present invention showing the support and the manner in which the plurality of electrical components are mounted and electrically connected thereto by means of the resilient conductor elements.
Figure 3:
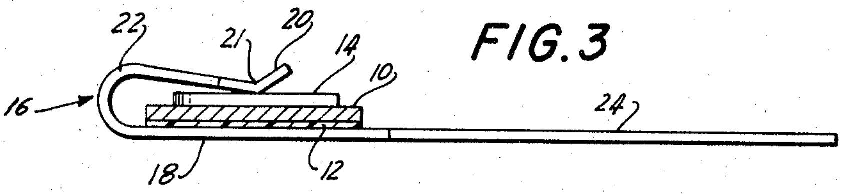
FIG. 3 is a cross-sectional view, on a somewhat enlarged scale, taken along the line 3—3 of FIG. 2.
Figure 4:
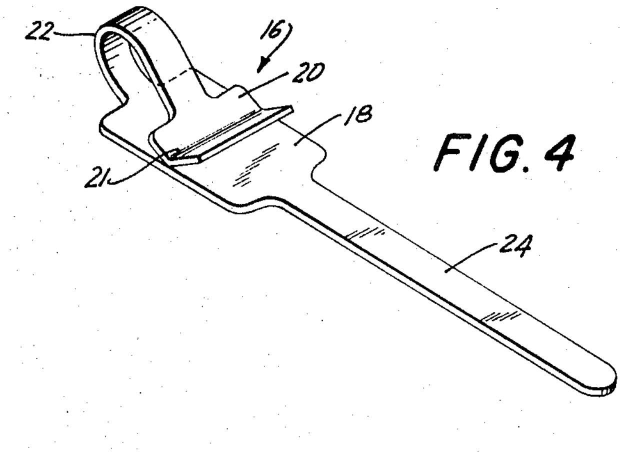
FIG. 4 is a three-quarter perspective view of one of the conductor elements used in the mounting assembly of FIG. 2.

As shown in FIG. 2, the assembly of the present invention comprises an elongated support 10 formed of any suitable conductive material which has a strip of insulating material 12 secured to its lower surface, thereby to define an insulating surface of the support. A plurality of individual electrical components or units 14 are mounted on the upper conductive surface of support 10. Units 14 are of a type having terminals on their upper and lower surfaces so that the mounting of the units on the conductive surface of support 10 is effective to electrically connect the terminals on the lower surfaces of units 14 with the conductive surface of support 10.

The individual units 14 are securely retained on the conductive surface of support 10 by means of a number of conductor elements each generally designated 16. As here specifically disclosed, individual conductor elements 16 are provided for each unit 14. Each conductor element 16 comprises lower and upper arms 18 and 20 overlying one another and connected by a resilient section 22 effective to urge arms 18 and 20 toward one another. To provide the desired degree of resilience, section 22 may be narrower than arms 18 and 20. Arm 20 may be transversely bent, at 21, so as to tend to make a line contact with arm 18. An elongated lead section 24 extends from arm 18.

The conductor elements 16 are preferably each one-piece units in which all the parts 18–24 are formed from an integral strip of suitable conductive, resilient material. Phosphor-bronze electro-plated with a thin layer of tin is suitable for this purpose. Support 10, which is relatively rigid, is also formed of a conductive material, for example, tinned cold rolled steel. The insulator strip 12 secured in any suitable manner to the under surface of support 10 to define the insulating surface, may conveniently be fishpaper or the like. Units 14 may be semiconductor rectifiers in the form of selenium rectifier pellets having cathode and anode terminals on their opposing (i.e. upper and lower) surfaces.

The fabrication of the mounting assembly of this invention is exceedingly simple. Electrical units 14 are mounted on the upper conductive surface of support 10, spaced from one another and positioned such that the terminals on their lower surfaces engage and electrically contact the conductive surface of support 10. The individual conductor elements 16 are then arranged in position with respect to the support 10 and the units 14 by moving the arm 20 away from arm 18 by a sufficient distance to permit the arm 20 to pass over the upper surface of unit 14 and arm 18 to engage the insulating under surface of support 10. Then arm 20 is released and is urged downward by the action of resilient portion 22 into a firm and secure engagement with the upper surface of the unit. This operation achieves a two-fold result: first, the engagement of the conducting arm 20 with the upper terminal of unit 14 establishes electrical contact between that terminal and arm 20 and thus with lead section 24; second, arm 20, being resiliently urged against unit 14, causes unit 14 to be pressed against the conductive surface of support 10 to securely retain the unit in its desired position on the support, and to establish a reliable electrical contact between the lower terminal of unit 14 and the conductive surface of support 10. As a result, the terminals of unit 14 are respectively connected to the conductive surface of support 10 and to the lead section 24 of the conductor element 16 with which the unit is engaged.

This operation is repeated for each of the units 14. In the completed assembly, as shown in FIG. 2, the lead sections 24 extending from each of individual conductor elements 16 are substantially parallel to one another and lie substantially in a common place to facilitate the making of external circuit connections to the units 14.

The lower terminals of each unit 14 are connected to a common electrical point defined by the upper surface of support 10. To complete the electrical circuit which includes these units, an external electrical source is connected to that common point and is thus electrically connected to the corresponding terminals of each unit 14. To this end, an additional conductor element **16*a*, which may be substantially identical in construction with the other conductor elements 16, is engaged with the upper and lower surfaces of support 10 and has a lead section 24*a* extending from support 10, preferably in the same direction with, and in substantially the same plane as, lead sections 24 of the conductor elements 16. The arm 20*a* of conductor element 16*a* is resiliently urged into contact with the upper conductive surface of support 10 at a location at which no unit is mounted. The external electrical circuit, which may conveniently be the system B-plus supply, is connected to lead section 24*a* and thus to the conductive surface of support 10**.

The resulting equivalent circuit diagram of this assembly is shown in FIG. 1, each unit being shown as a diode D having an anode terminal connected to a line 26 which represents the conductive surface of support 10 and the lead section **24*a* of conductor element 16*a*. The cathode terminal of each diode D is connected to an individual line 28 corresponding to a lead section 24 of the corresponding individual conductor element 16**.

After the device has been thus assembled, it may be used as such. However, for greater permanency and protection, the assembly may be inserted into an open-sided plastic shell, the lead sections 24 and **24*a*** projecting out from that shell, after which a plastic encapsulation step using epoxy resin, for example, is carried out. This will produce a sturdy module with printed circuit type leads extending therefrom.

It will be apparent from the above description of the present invention that the assembly of the plurality of electrical units (e.g. diodes) can be achieved in an extremely simple manner by personnel having relatively low levels of skill through the use of standard parts which are readily and inexpensively fabricated in large quantities. As a result, the overall production cost of the assembly is relatively low. The simple act of mounting the resilient conductor elements 16 in a manner such that they engage the upper surfaces of the units 14 to urge the latter into electrical contact with the support 10, and extend under the insulated surface of the support 10, assures reliable electrical contact with the terminals of the units and reliable retention of the electrical units on the support.

The assembly may be utilized with different types of electrical units 14 in addition to the selenium rectifier elements mentioned herein. The electrical units utilized in a particular assembly need not all be identical but need only have terminals which can be engaged both by the conductor elements and the upper conductive surface of the support.

While only a single embodiment of this invention has been herein specifically disclosed, it will be apparent that many variations may be made thereto without departing from the spirit and scope of the invention.

I claim:

1. A mounting assembly for a plurality of electrical units each having a pair of terminals, said assembly comprising and elongated support having a conductive surface and an insulating suface, said units being mounted on and positioned along said support each with one of its terminals engaging and making electrical contact with said conductive surface, a plurality of conductor elements having a pair of arms, one of said arms engaging said insulating surface and the other of said arms engaging an electrical unit, urging said unit against said conductive surface, and comprising a conductive part making electrical connection with said other terminal of the corresponding electrical unit, and means active on said other of said arms and effective to resiliently urge said arm toward said conductive surface of said support.

2. The mounting assembly of claim 1, in which said conductive and insulating surfaces are located on opposite surfaces of said support, and in which said arms of said conductor elements extend over said conductive and insulating surfaces respectively and are connected by a resilient portion which extends around an edge of said support, said portion comprising said means for resiliently urging said other of said arms toward said conductive surface of said support.

3. The mounting assembly of claim 2, in which said conductor elements each comprise a section extending beyond said support, said section being electrically connected to said conductive part of said other of said arms.

4. The mounting assembly of claim 3, in which said extending section of said conductor elements lie substantially in a common plane.

5. The mounting assembly of claim 4, in which said conductor elements comprise an integral body of conductive material.

6. The mounting assembly of claim 1, in which said conductor elements each comprise a section extending beyond said support, said section being electrically connected to said conductive part of said other of said arms.

7. The mounting assembly of claim 6, in which said extending sections of said conductor elements lie substantially in a common plane.

8. The mounting assembly of claim 7, in which said conductor elements comprise an integral body of conductive material.

9. The mounting assembly of claim 1, in which said conductor elements comprise an integral body of conductive material.

10. In the mounting assembly of claim 1, means for making external electrical connection with said conductive surface of said support comprising an additional conductor element of the type defined in claim 1, said other of the arms of which engages and makes electrical connection with said conductive surface of said support.

11. The mounting assembly of claim 10, in which said additional conductor element is provided with a section extending beyond said support, said section being electrically connected to said other of said arms.

12. In the mounting assembly of claim 2, means for making external electric connection with said conductive surface of said support comprising an additional conductor element of the type defined in claim 2, said other of the arms of which engages and makes electrical connection with said conductive surface of said support.

13. The mounting assembly of claim 12, in which said additional conductor element is provided with a section extending beyond said support, said section being electrically connected to said other of said arms.

14. In the mounting assembly of claim 7, means for making external electrical connection with said conductive surface of said support comprising an additional conductor element of the type defined in claim 7, said other of the arms of which engages and makes electrical connection with said conductive surface of said support.

15. The mounting assembly of claim 4, in which said additional conductor element is provided with a section extending beyond said suport so as to be substantially in a common plane with said sections extending from said other conductor element, said section being electrically connected to said other of said arms.

16. In the mounting assembly of claim 9, means for making external electrical connection with said conductive surface of said support comprising an additional conductor element of the type defined in claim 9, said other of the arms of which engages and makes electrical connection with said conductive surface of said support.

17. The mounting assembly of claim 16, in which said additional conductor element is provided with a section extending beyond said support, said section being electrically connected to said other of said arms.

18. In the mounting assembly of claim 5, means for making external electrical connection with said conductive surface of said support comprising an additional conductor element of the type defined in claim 5, said other of the arms of which engages and makes electrical connection with said conductive surface of said support.

19. The mounting assembly of claim 18, in which said additional conductor element is provided with a section extending beyond said support so as to be substantially in a common plane with said sections extending from said other conductor element, said section being electrically connected to said other of said arms.

References Cited

UNITED STATES PATENTS

| | | | |
|---|---|---|---|
| 3,011,379 | 12/1961 | Corwin | 317—101(CX)X |
| 3,270,399 | 9/1966 | Ohntrup | 137—101(CX) |
| 3,319,166 | 5/1967 | Coleman | 317—101(CC) |

ROBERT K. SCHAEFER, Primary Examiner

J. R. SCOTT, Assistant Examiner

U.S. Cl. X.R.

339—17